United States Patent
Shao et al.

(10) Patent No.: US 12,406,729 B2
(45) Date of Patent: Sep. 2, 2025

(54) NON-VOLATILE MEMORY WITH INTER-DIE CONNECTION

(71) Applicant: Sandisk Technologies, Inc., Milpitas, CA (US)

(72) Inventors: Shiqian Shao, Fremont, CA (US); Tuan Pham, San Jose, CA (US); Fumiaki Toyama, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 549 days.

(21) Appl. No.: 17/825,337

(22) Filed: May 26, 2022

(65) Prior Publication Data

US 2023/0386576 A1 Nov. 30, 2023

(51) Int. Cl.
| | |
|---|---|
| *G11C 5/04* | (2006.01) |
| *G11C 16/04* | (2006.01) |
| *G11C 16/14* | (2006.01) |
| *G11C 16/26* | (2006.01) |
| *H10B 43/10* | (2023.01) |
| *H10B 43/27* | (2023.01) |
| *H10B 43/35* | (2023.01) |

(52) U.S. Cl.
CPC .......... *G11C 16/0483* (2013.01); *G11C 16/14* (2013.01); *G11C 16/26* (2013.01); *H10B 43/10* (2023.02); *H10B 43/27* (2023.02); *H10B 43/35* (2023.02)

(58) Field of Classification Search
CPC .......... G11C 5/025; G11C 5/04; G11C 5/063; G11C 11/4097; G11C 7/18
USPC .................................................. 365/51, 63
See application file for complete search history.

(56) References Cited

U.S. PATENT DOCUMENTS

| | | | |
|---|---|---|---|
| 5,604,710 A * | 2/1997 | Tomishima | G11C 29/26 365/201 |
| 8,421,245 B2 | 4/2013 | Gonzalez | |
| 10,037,926 B2 | 7/2018 | Hargan | |
| 10,978,348 B2 | 4/2021 | DeLaCruz | |
| 11,069,571 B2 | 7/2021 | Hollis | |
| 11,335,411 B1 * | 5/2022 | Lien | G11C 16/14 |
| 2021/0373993 A1 | 12/2021 | Sharon | |
| 2022/0130466 A1 * | 4/2022 | Bazarsky | G11C 16/3427 |

* cited by examiner

*Primary Examiner* — Son T Dinh
(74) *Attorney, Agent, or Firm* — PEARL COHEN ZEDEK LATZER BARATZ LLP

(57) ABSTRACT

A non-volatile memory apparatus comprises a stack of integrated memory assemblies. Each integrated memory assembly includes a memory die bonded to a control die and a set of power pads connected to metal lines in the respective memory die and control die. The memory dies comprise a non-volatile memory structure and a top metal layer for transmitting power signals above the memory structure. The control dies comprise a substrate, a control circuit positioned on the substrate for performing memory operations on a corresponding memory structure and a set of metals layers above the control circuit. The substrate comprises a set of conductive vias through the substrate that connect at one end to the top metal layer of the memory die of an adjacent integrated memory assembly and connect at a second end to the set of metals layers above the control circuit for routing signals between integrated memory assemblies.

17 Claims, 21 Drawing Sheets

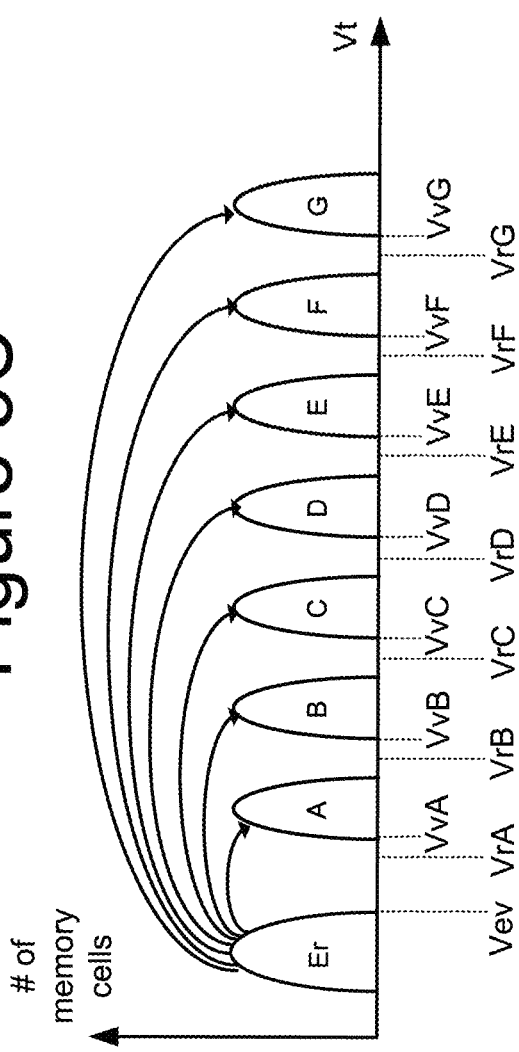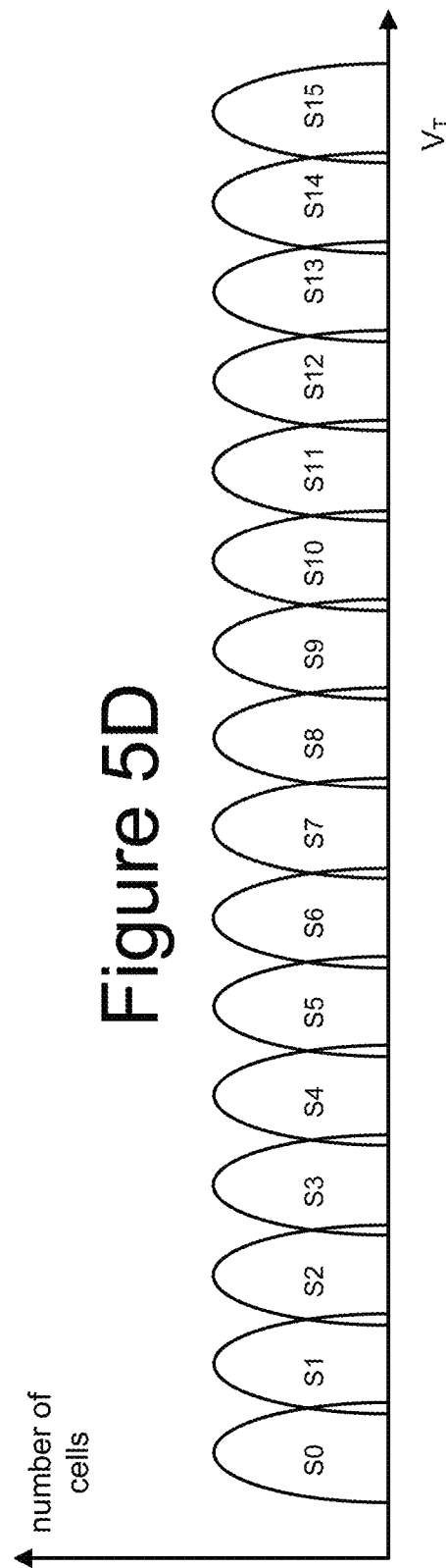

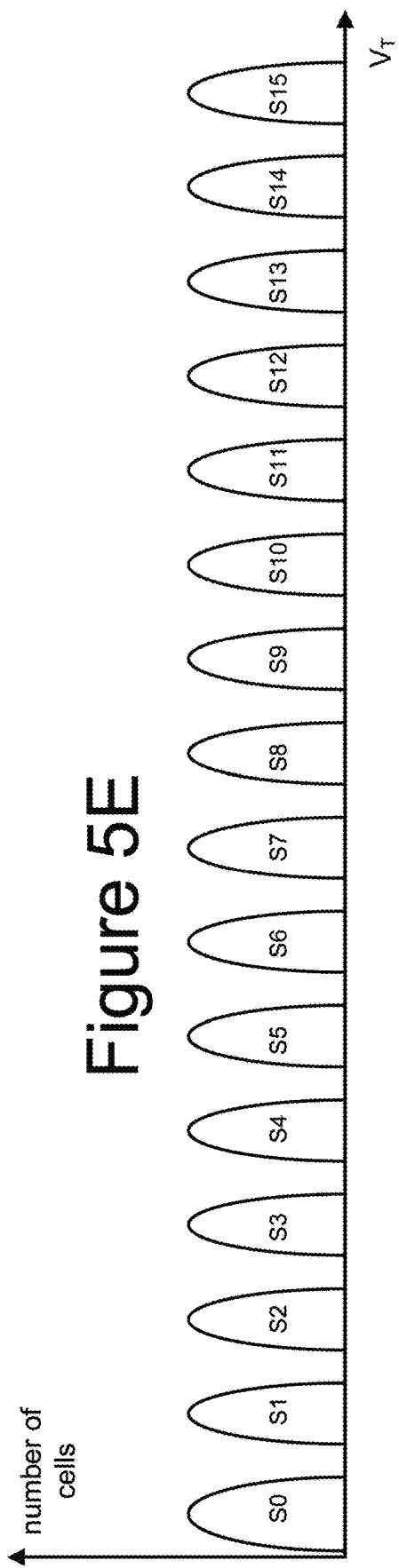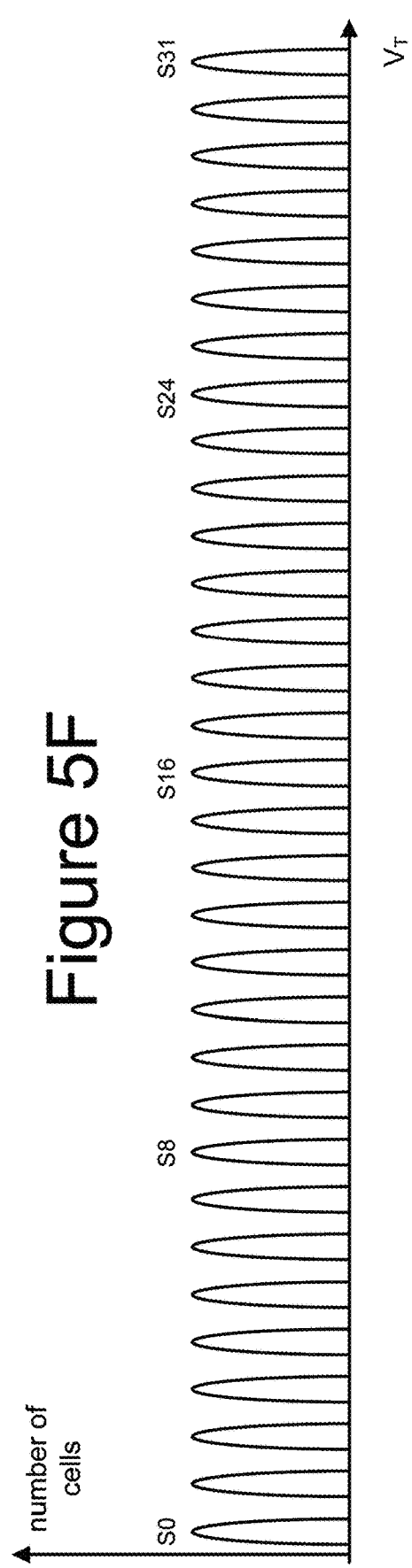

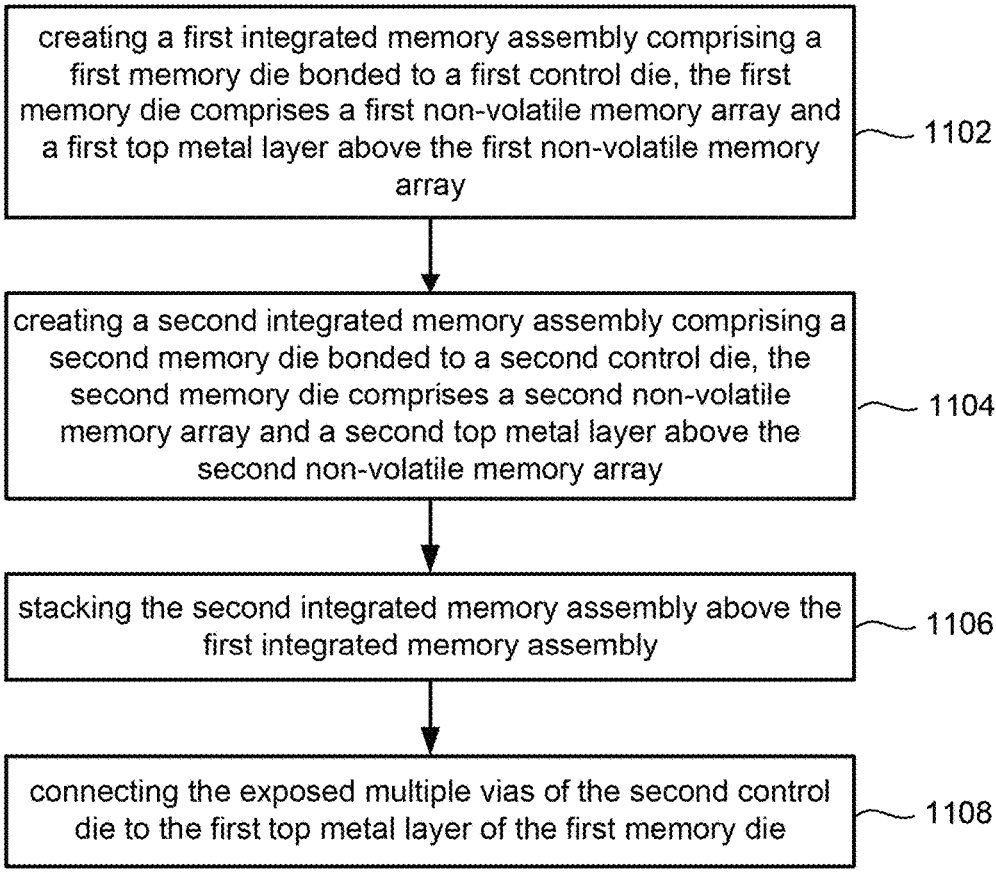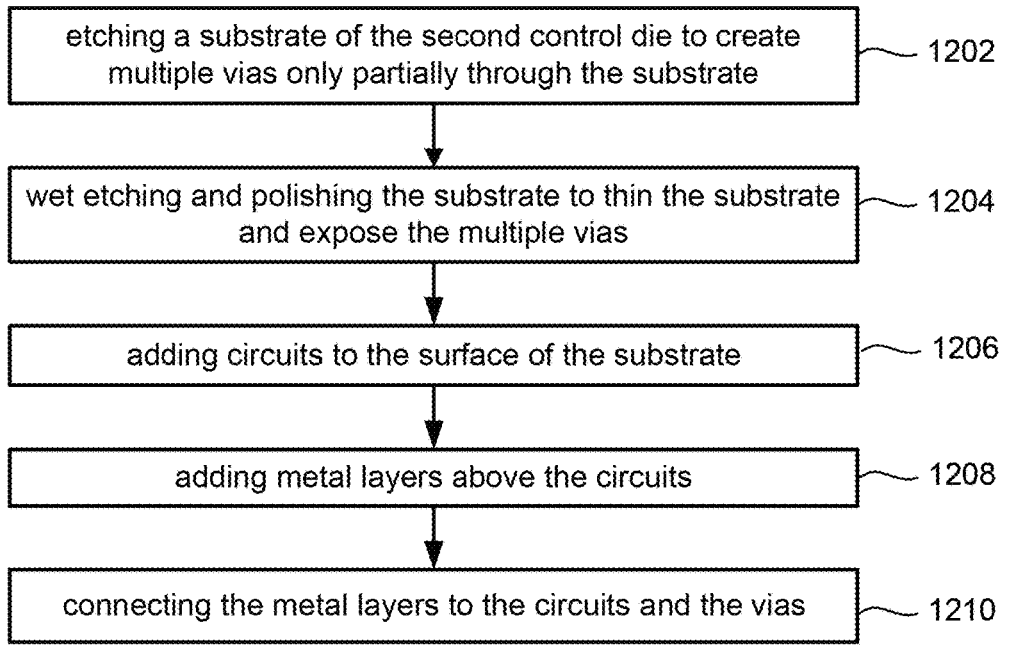

NON-VOLATILE MEMORY WITH INTER-DIE CONNECTION

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a power source (e.g., a battery). One example of non-volatile memory is flash memory (e.g., NAND-type and NOR-type flash memory).

There is a trend to have higher capacity memories that include more functionality. Adding more function and memory can require more power. However, adding more capacity for power can utilize space on the semiconductor die that could otherwise be used for other functions.

BRIEF DESCRIPTION OF THE DRAWINGS

Like-numbered elements refer to common components in the different figures.

FIG. 5C depicts threshold voltage distributions.
FIG. 5D depicts threshold voltage distributions.
FIG. 5E depicts threshold voltage distributions.
FIG. 5F depicts threshold voltage distributions.

FIG. 11 is a flow chart describing one embodiment of a process for fabricating a stack of integrated memory assemblies.

FIG. 12 is a flow chart describing one embodiment of a process performed while fabricating a control die of an integrated memory assembly.

DETAILED DESCRIPTION

Despite the extra power needs of advanced non-volatile memories, current memory designs do not always have sufficient space and/or flexibility to accommodate all power demands. Therefore, design compromises are sometimes made.

Typically, engineers design the power lines for each die separately. It is proposed, however, to consider the entire stack of dies for a memory system when designing power lines in order to build in more flexibility. Therefore, the memory system can share powerlines among different dies to greatly improve system powerline efficiency and strength. For example, a non-volatile memory apparatus may comprise a stack of integrated memory assemblies. Each integrated memory assembly includes a memory die bonded (or otherwise directly connected to) to a control die and a set of power pads. The power pads are connected to metal lines in the respective memory die and control die. The memory dies comprise a non-volatile memory structure and a top metal layer for transmitting power signals above the memory structure. The control dies comprise a substrate, a control circuit positioned on the substrate for performing memory operations on a corresponding memory structure and a set of metals layers above the control circuit. The substrate comprises a set of conductive vias that extend completely through the substrate. These vias connect at one end to the top metal layer of the memory die of an adjacent integrated memory assembly and connect at a second end to the set of metals layers above the control circuit (via switches) for routing signals between integrated memory assemblies.

Figure 1:
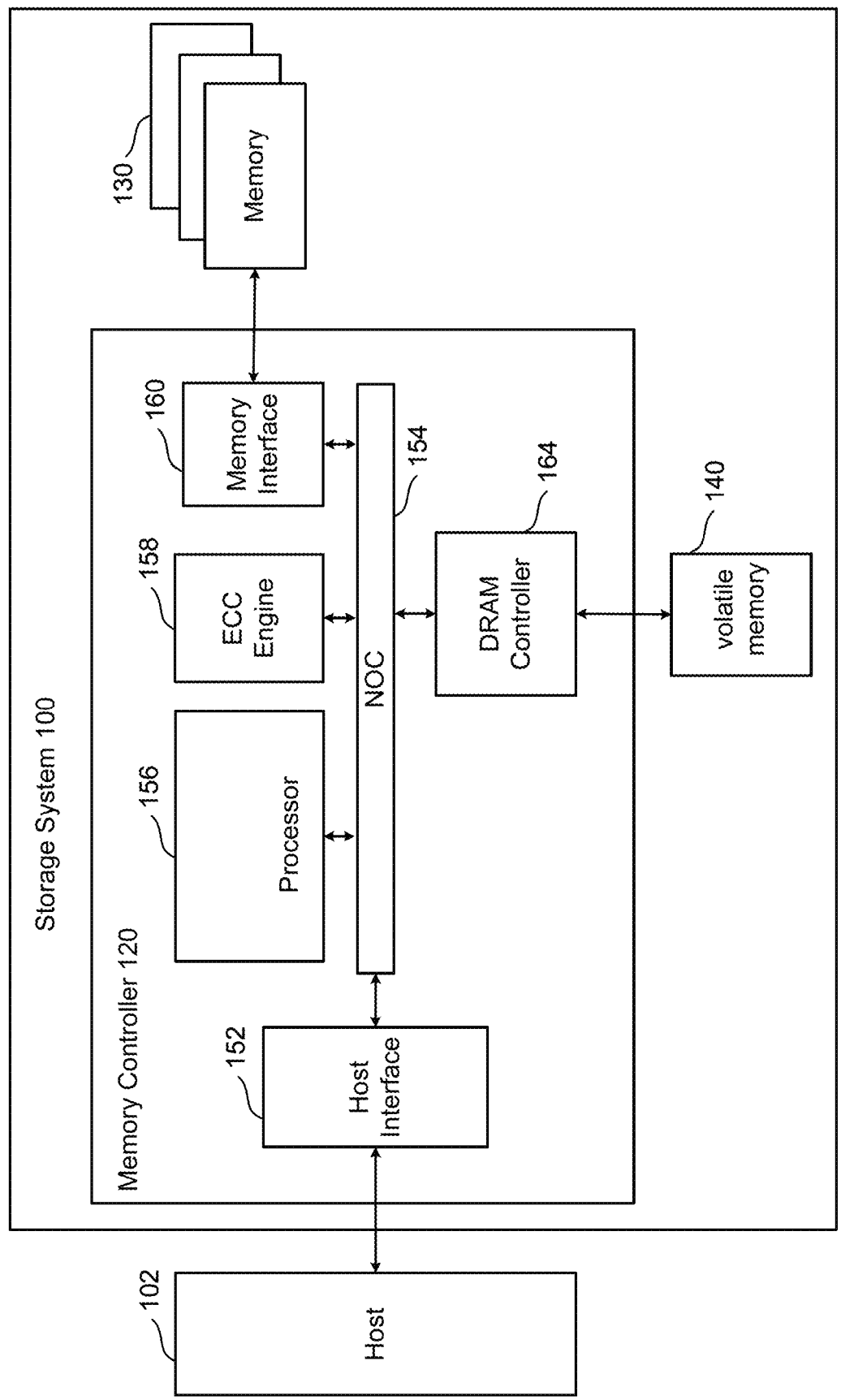
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
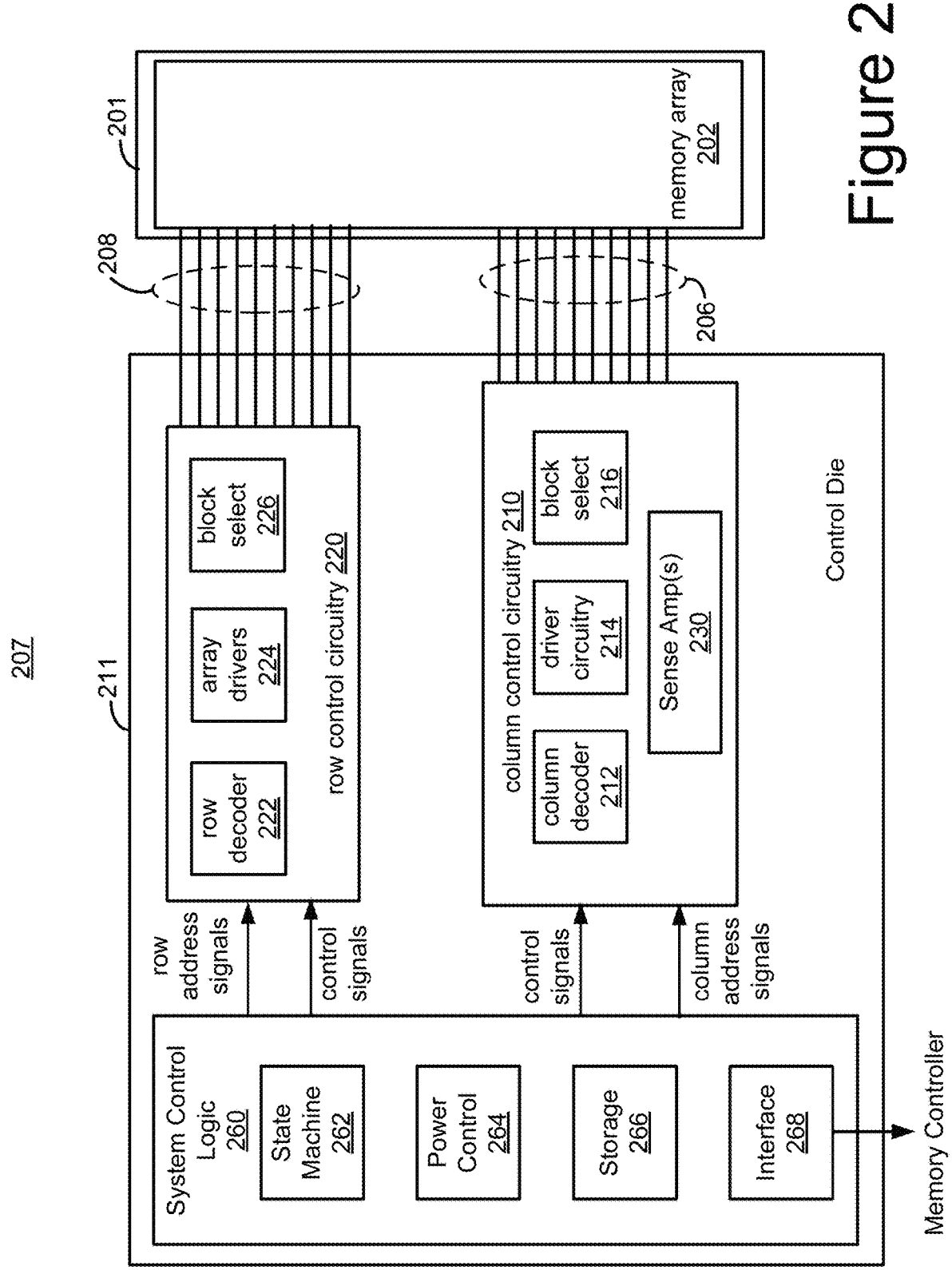
FIG. 2 is a block diagram of one embodiment of an integrated memory assembly.

FIG. 2 shows an embodiment for non-volatile memory 130 that is implemented using wafer-to-wafer bonding to provide a bonded die pair, referred to as an integrated memory assembly. FIG. 2 depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes system control logic 260, row control circuitry 220, and column control circuitry 210. In some embodiments, control die 211 is configured to connect to the memory structure 202 in the memory die 201. In some embodiments, the memory die 201 and the control die 211 are bonded together.

Memory die 201 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Control die 211 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Control die 211 also includes column control circuitry 210, including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 266 (e.g., RAM, registers, latches, etc.), which may be used to store parameters for operating the memory array 202.

Commands and data are transferred between memory controller 120 and control die 211 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). The control die 211 could also be referred to as a CMOS die, due to the use of CMOS technology to implement some or all of control circuitry 260, 210, 220.

FIG. 2 shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
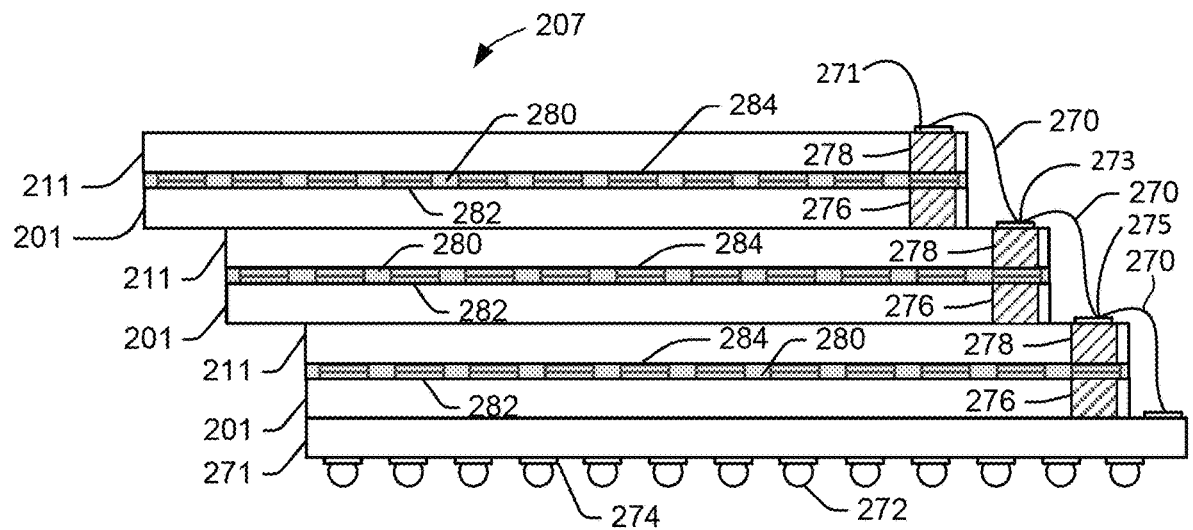
FIGS. 3A and 3B depict different embodiments of integrated memory assemblies.

In some embodiments, there is more than one control die 211 and more than one memory die 201 in an integrated memory assembly 207. In some embodiments, a memory system includes a stack of multiple integrated memory assemblies (e.g., a stack of multiple control die 211 and multiple memory die 201). FIG. 3A depicts a side view of an embodiment of a stack of multiple integrated memory assemblies (e.g., a stack of multiple control die 211 and multiple memory die 201), stacked on a substrate 271. The stack of FIG. 3A has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211 via the bond pads, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the pads at each level uncovered and accessible from above. Wire bonds 270 connected to the bond pads connect the control die 211 to the substrate 271. A number of such wire bonds may be formed across the width of each control die 211 (i.e., into the page of FIG. 3A). For example, power pads 271, 273, and 275 may be used to receive/transmit power signals (e.g., ground or a voltage source) via the wire bonds 270.

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
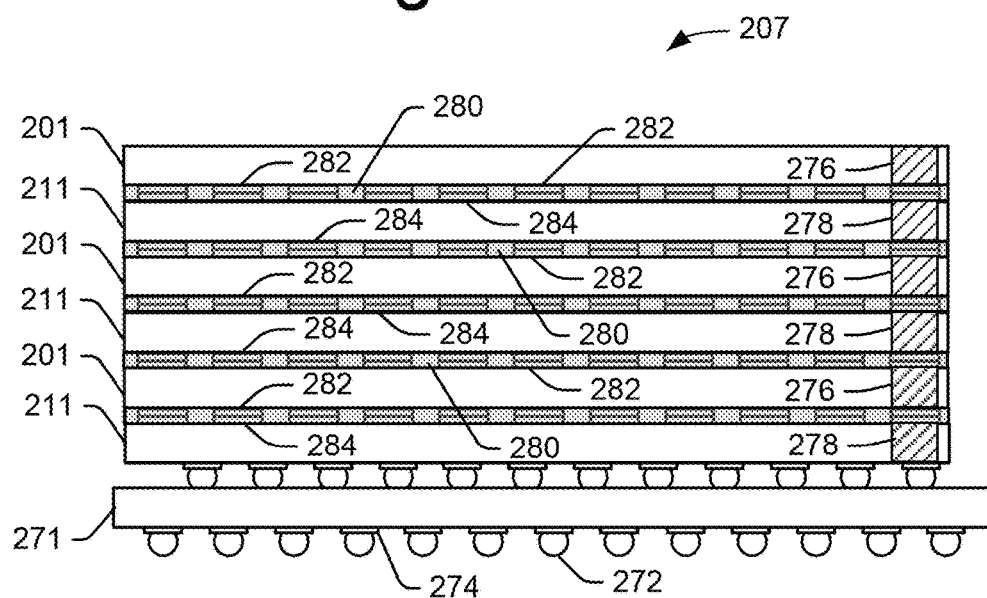

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
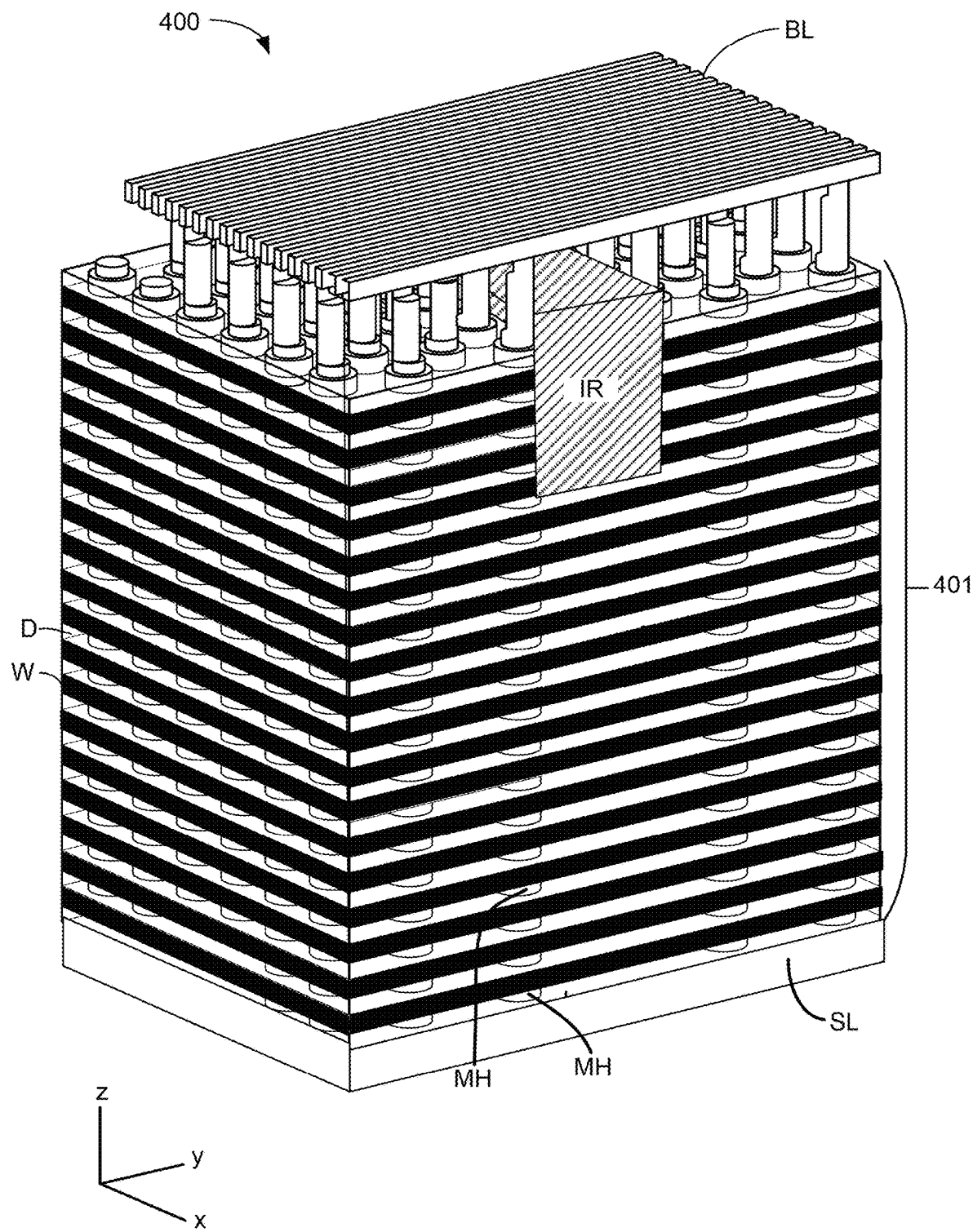
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
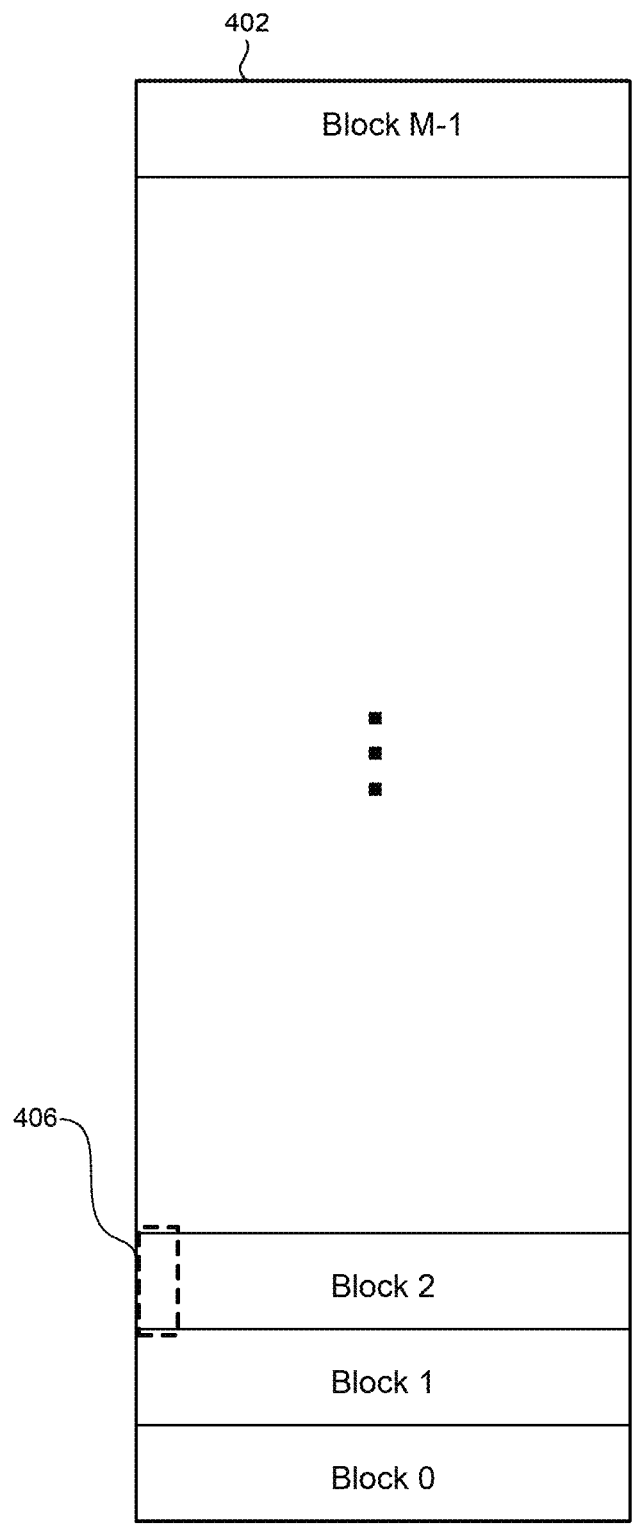
FIG. 4A is a block diagram of one plane of a memory structure.

FIG. 4A is a block diagram depicting one example organization of one plane 402 of memory structure 202. In some embodiments, memory structure 202 may include more than one plane (e.g., 2 planes, 4 planes, 8 planes, etc.). Plane 402 is divided into M blocks. In one example, each plane has about 2000 blocks. However, different numbers of blocks can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the non-volatile memory cells of a block share a common set of word lines. For example, the word lines for a block are all connected to all the vertical NAND strings for that block (e.g., a block comprises a plurality of NAND strings connected to a common set of word lines). Although FIG. 4A shows one plane 402, more than one plane can be implemented. In some embodiments, memory structure 202 includes eight planes.

Figure 4B:
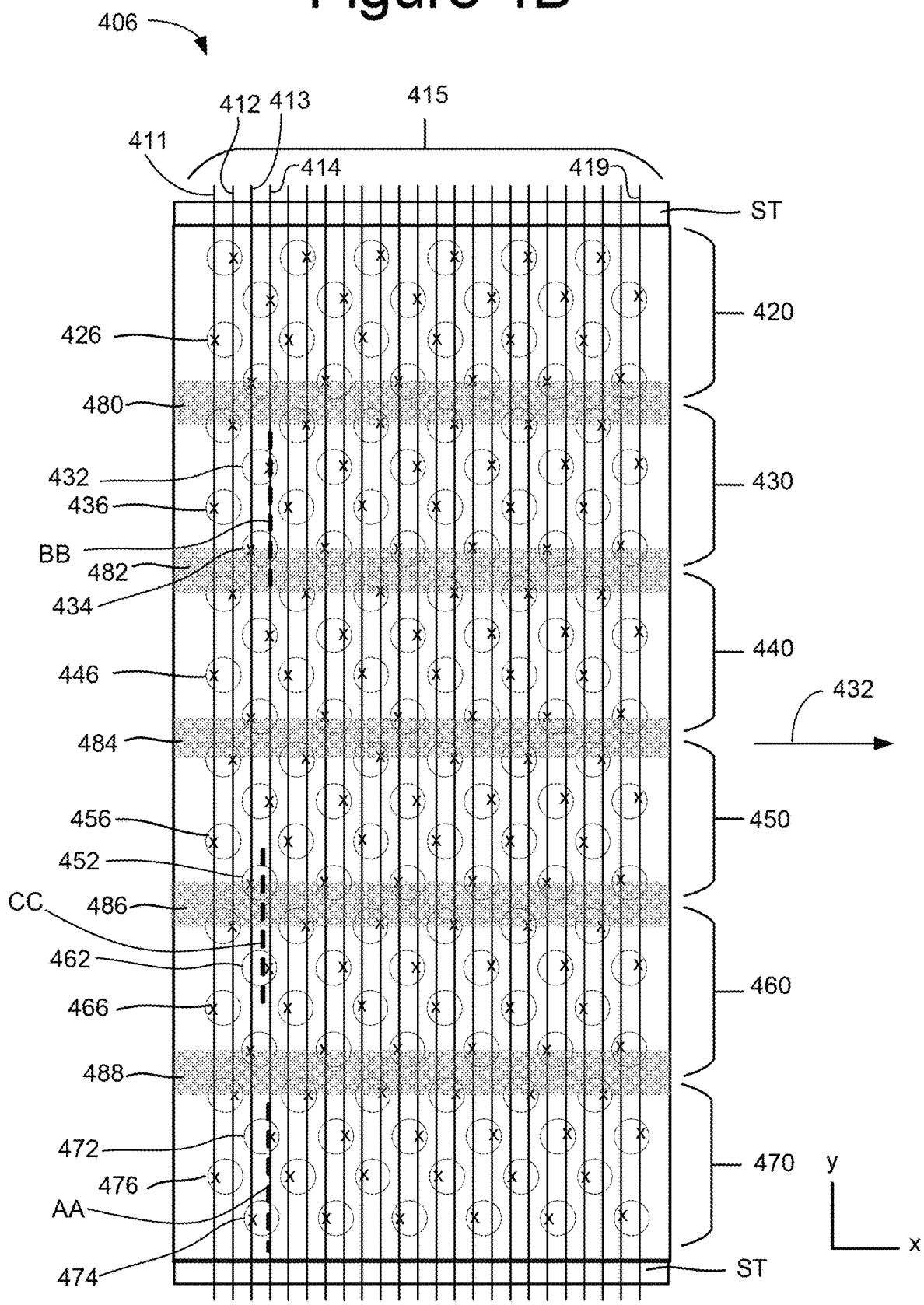
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

The top and bottom of the blocks of memory cells include ST regions. In one embodiment, the ST regions are metal sheets that separate blocks and provide an electrical connection from above memory structure 202 to the source line SL (see FIGS. 4C, 4D and 4J).

Figure 4C:
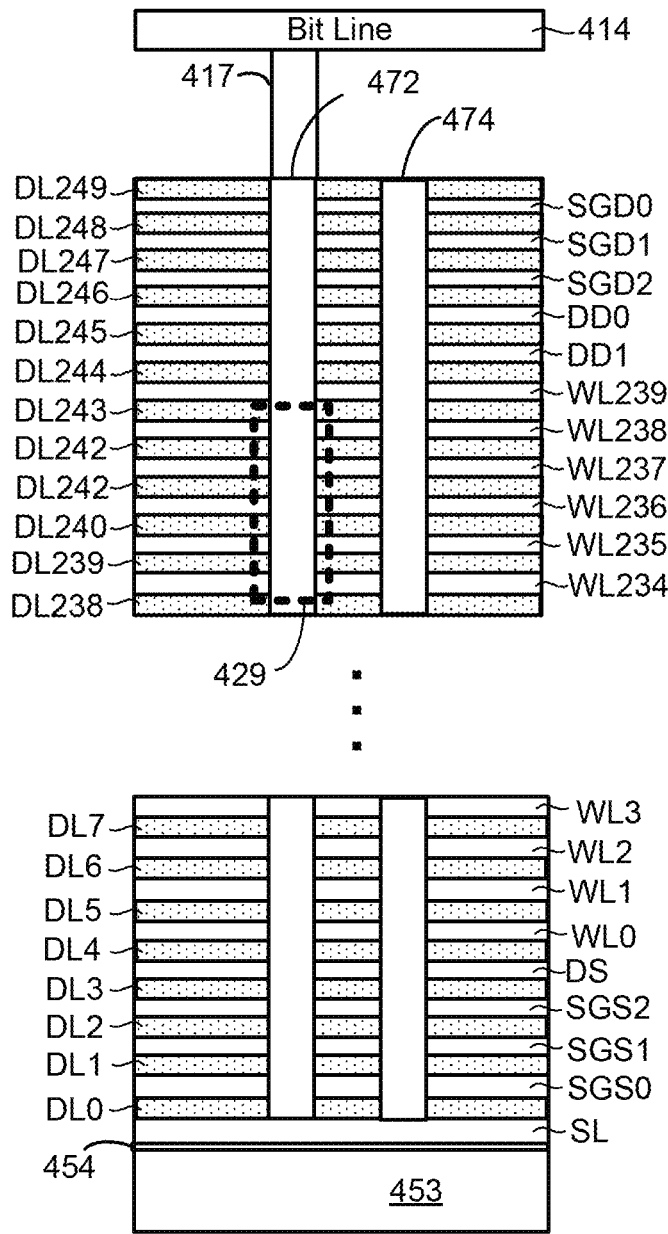
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
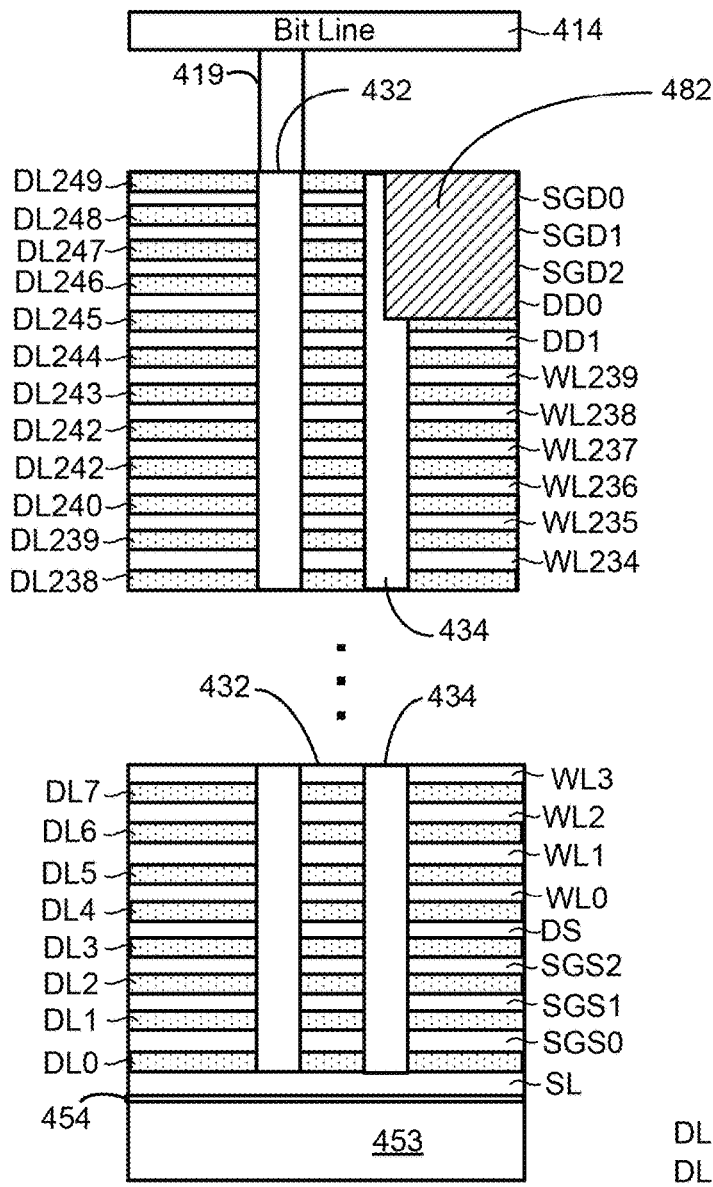
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
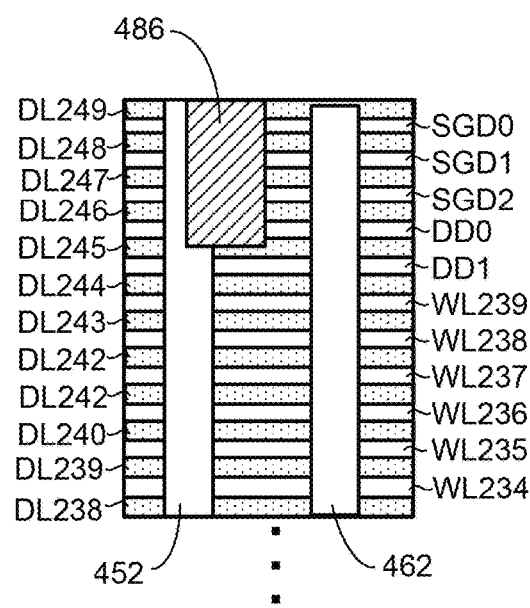
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
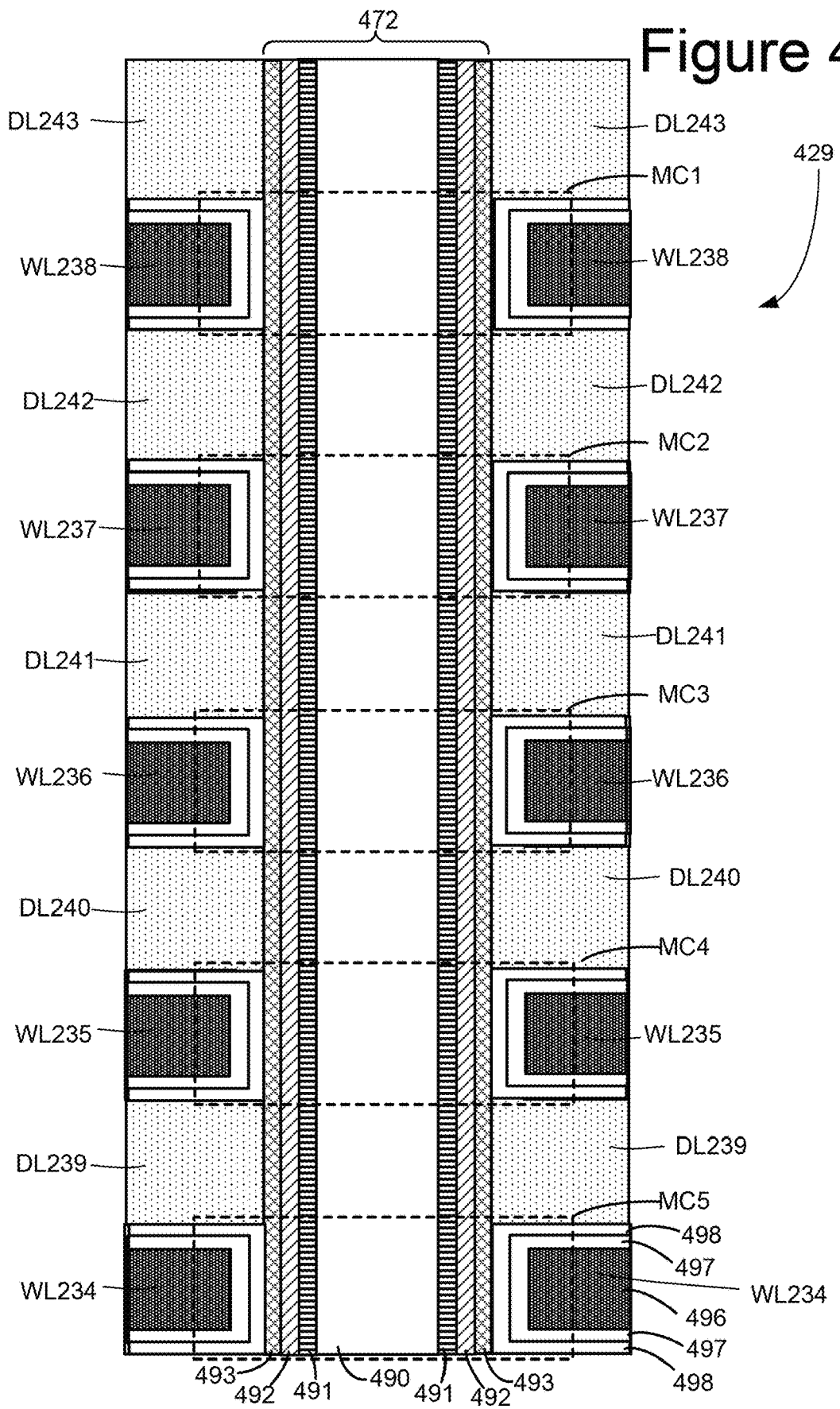
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DL243, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
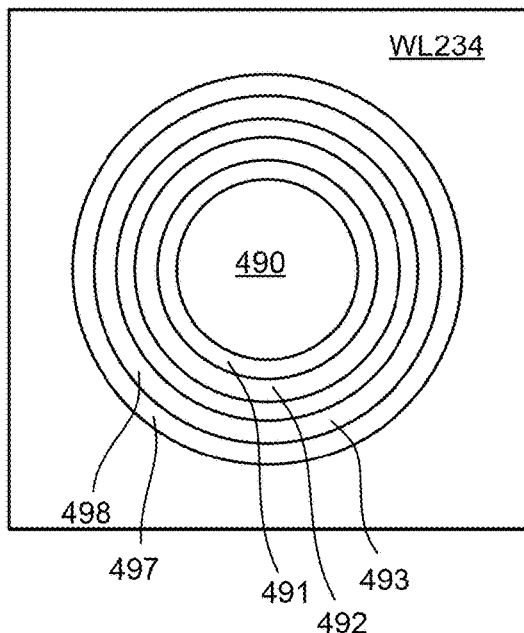
FIG. 4G depicts a cross section of a vertical column that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
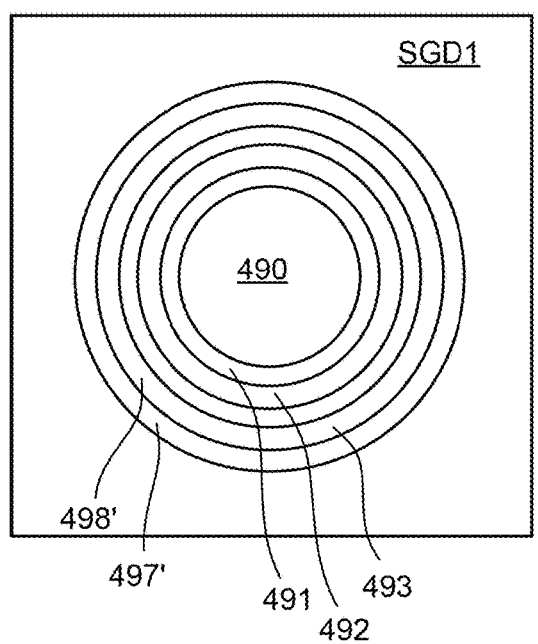
FIG. 4H depicts a cross section of a vertical column that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
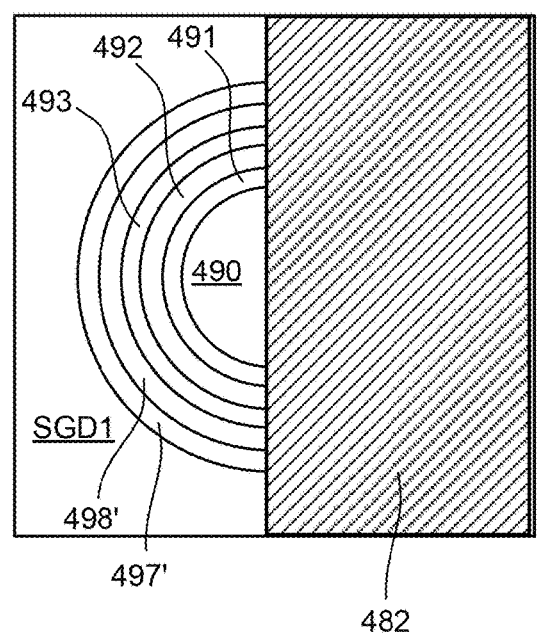
FIG. 4I depicts a cross section of a vertical column that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
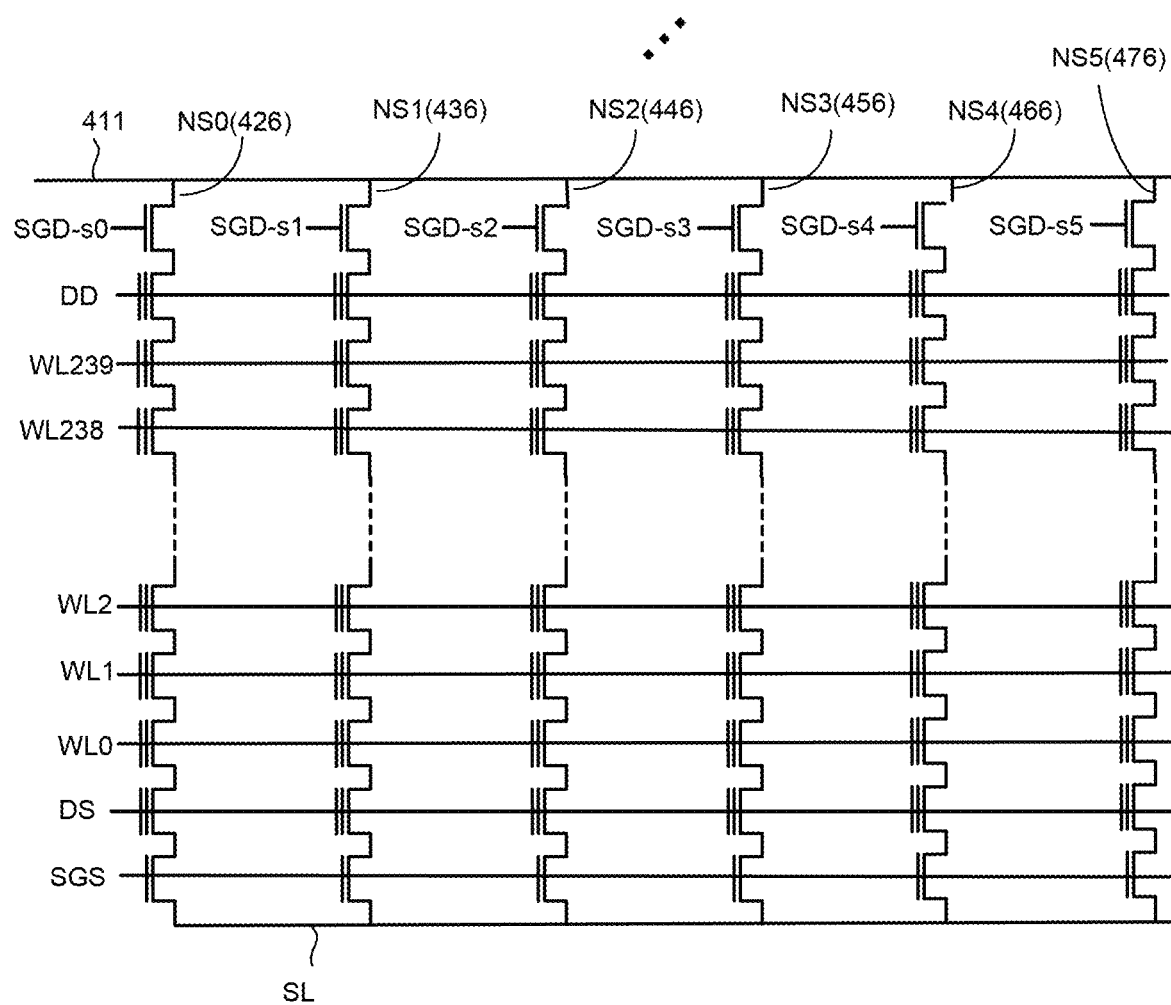
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 488) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
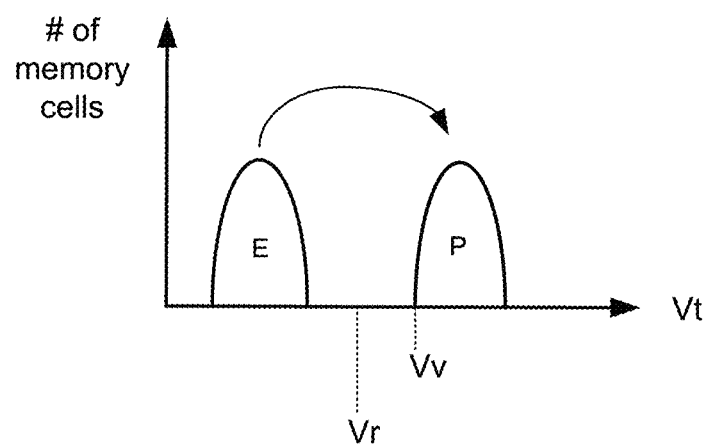
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
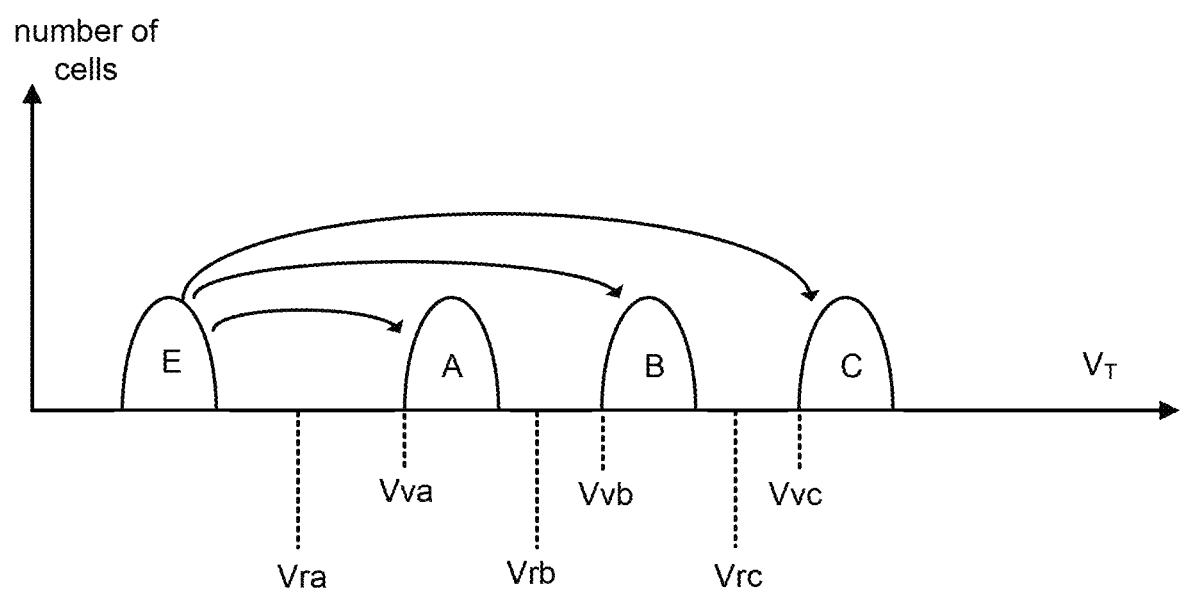
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
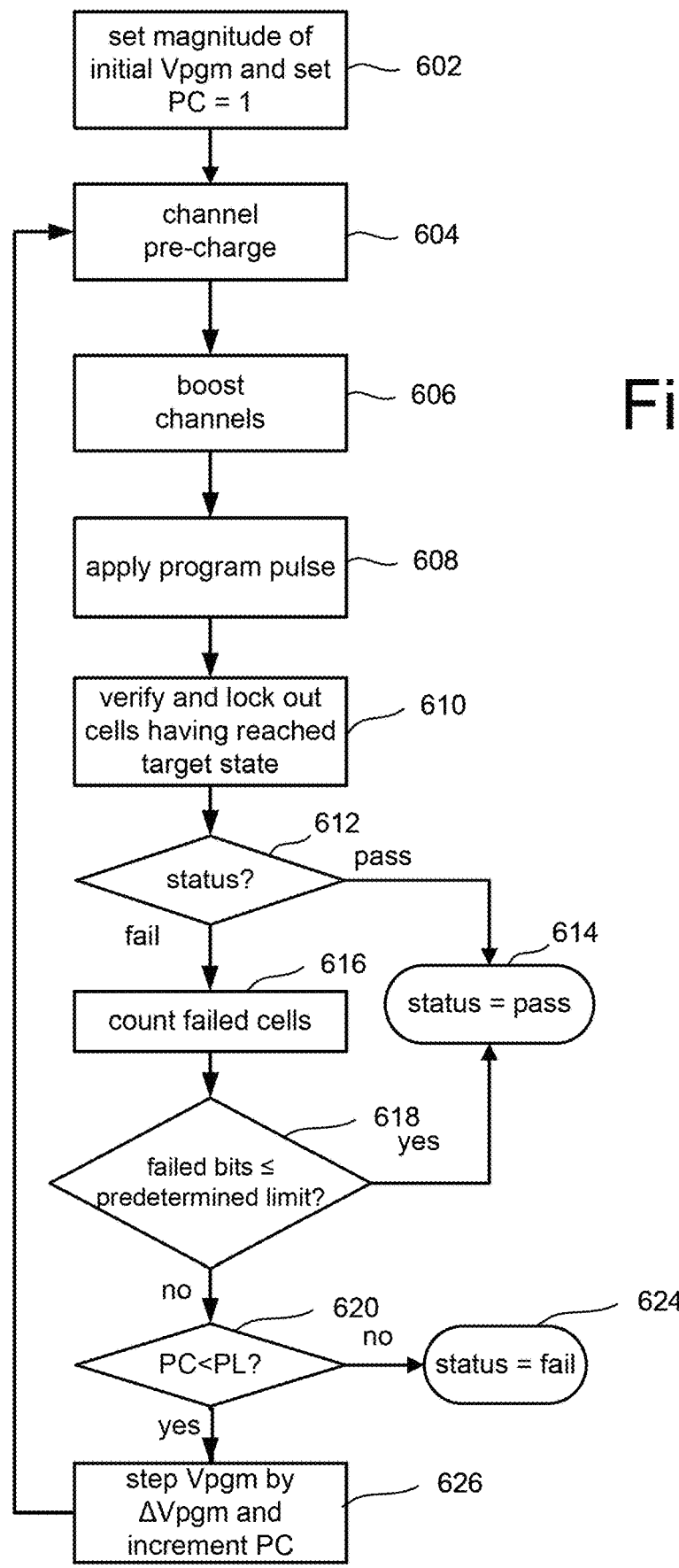
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
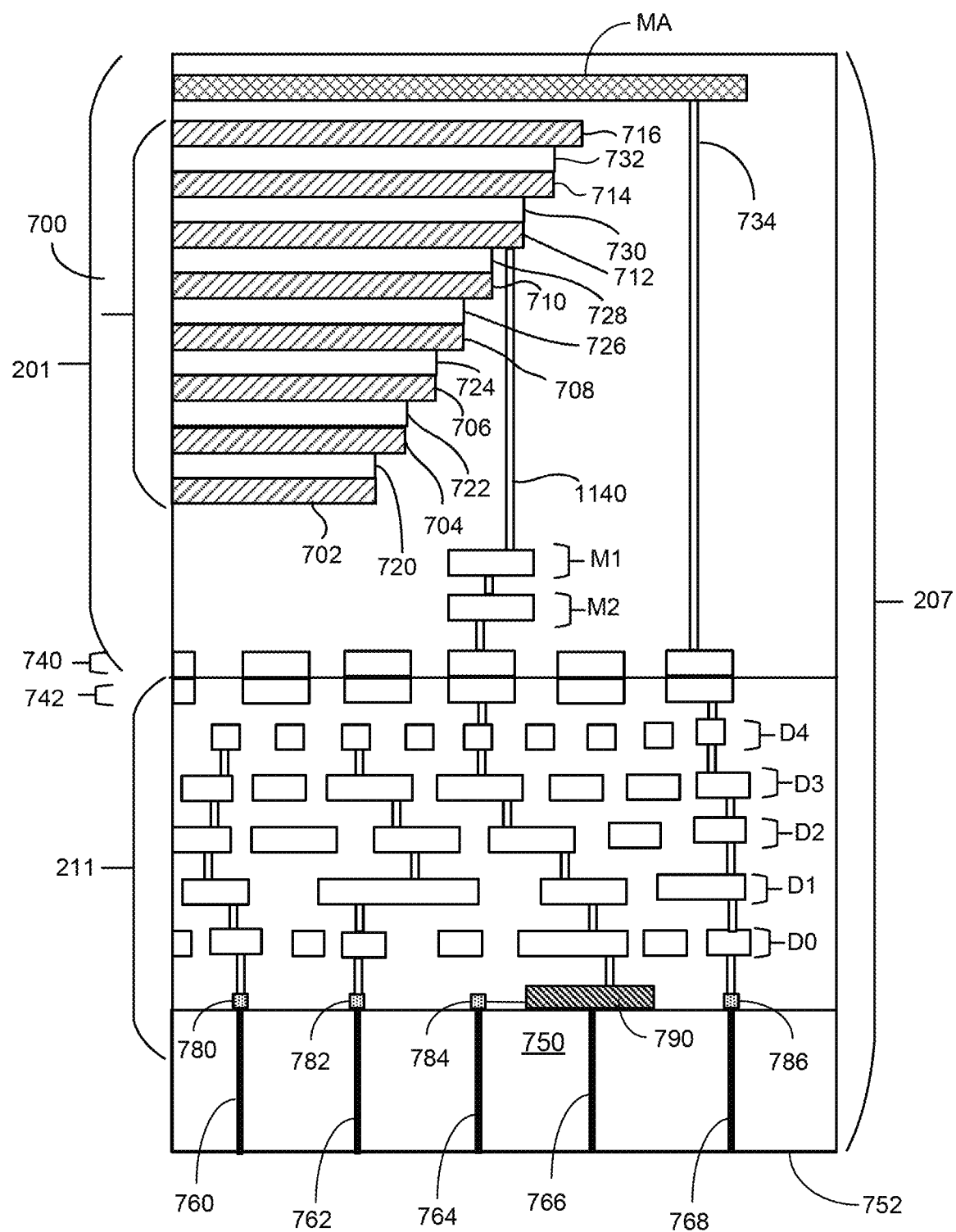
FIG. 7 is a cross section of a portion of an integrated memory assembly.

FIG. 7 is a cross section of a portion of an integrated memory assembly 207 comprising a memory die 201 bonded (or otherwise directly connected to) to a control die 211. Memory die 201 comprises a three dimensional non-volatile memory structure 700 (e.g., one embodiment of memory structure 202) that includes multiple planes (e.g., plane 402 and other planes) employing the structure and function described above. A portion of the memory structure 700 (memory array) e.g., for one plane is depicted, including word lines 702, 704, 706, 708, 710, 712, 714, and 716 and dielectric layers 720, 722, 724, 726, 728, 730, and 732. As can be seen from FIG. 7, the word lines 702-716 are arranged in an inverted staircase structure such that word line length increases from bottom to top of the three dimensional non-volatile memory structure 700. FIG. 7 shows memory die 201 having at least three metal layers for implementing power and signal lines: M1 and M2 below memory structure 700 and MA above memory structure 700. In other embodiments, more or less than three metal layers can be implemented on memory die 201. Below the word lines and above metal layer M1 are a plurality of bit lines (not depicted in FIG. 11), and below metal layer M2 are a set of bond pads 740 for memory die 201. For example purposes, FIG. 7 shows via 734 connecting MA to a bond pad and via 1140 connecting word line 712 to a bond pad through M1 and M2.

Control die 211 includes a substrate 750. In one embodiment, the components of system control logic 260, row control circuitry 220, and column control circuitry 210 (see FIG. 2) are implemented as CMOS electrical circuits on substrate 750. Electrical circuit 790 is one example of a CMOS electrical circuit on substrate 750 that can be part of any or all of system control logic 260, row control circuitry 220, and column control circuitry 210. Above substrate 750 (and above any circuits implemented on the top surface of substrate 750) are five metal layers for implementing power and signal lines: D0, D1, D2, D3, D4, and D5. In other embodiments, more or less than five metal layers can be implemented on control die 211. Above metal layers D0-D4 are a plurality of bond pads 742 that line up with bond pads 740 in order to bond control die 211 to control die 201. That is, in one embodiment, each (or a subset) of bond pads 742 is bonded to a corresponding and aligned bond pad of plurality bond pads 740. Metal line layers D0-D4 are configured to connect the circuits on substrate 750 to bond pads 1022.

In one embodiment, layers MA and D4 are predominantly used for power signals (e.g., ground Vss and/or voltage source Vext). Although not depicted in FIG. 7, the integrated memory assembly comprising memory die 201 and control die 211 includes a set of power pads for connecting to one or more external voltage sources and ground. The power pads also connect to power lines on MA and D4.

Current memory designs do not have sufficient space and/or flexibility in MA and D4 to accommodate all power demands. Therefore, design compromises are sometimes made. Typically, engineers design the power lines for each die separately. It is proposed, however, to consider the entire stack of integrated memory assemblies when designing power lines in order to build in more flexibility. Therefore, the memory system can share powerlines among different dies to greatly improve system powerline efficiency and strength. To share powerlines among different dies, it is proposed to route power signals between a control die of one integrated memory assembly and a memory die of an adjacent integrated memory assembly by way of vias through the substrate of the control die. For example, FIG. 7 shows conductive vias 760, 762, 764, 766 and 768 extending completely through substrate 750. In one embodiment, vias 760, 762, 764, 766 and 768 are Tungsten; however, in other embodiments the vias can be a different metal or other conductive material. One end of vias 760-768 connect to components on the control die (e.g., components on the top surface of substrate 750 and/or to the metal layers D0-D4). The second end of the vias 760, 762, 764, 766 and 768 are exposed at bottom surface 752 of substrate 750 for connecting to power lines at metal layer MA of a memory die in an adjacent integrated memory assembly. FIG. 7 shows five vias 760, 762, 764, 766 and 768 extending through substrate 750 for example purposes and to keep FIG. 7 readable; however, in other embodiments there may be tens of thousands or millions of vias extending through substrate 750 for purposes of transmitting/routing power signals between dies of different integrated memory assemblies.

In one embodiment, vias 760-768 connect to switches (e.g., transistors or other types of switches) on control die 211. For example, FIG. 7 shows switch 780 connected to via 760 to control access to via 760. When switch 780 is open, a power signal can be transmitted between (either direction) the control die and an adjacent memory die of an adjacent integrated memory assembly by way of via 760. When switch 780 is closed, via 760 cannot transmit a power signal between the control die and an adjacent memory die of an adjacent integrated memory assembly. FIG. 7 also shows switch 782 connected to via 762 to control access to via 762, switch 784 connected to via 764 to control access to via 764, and switch 786 connected to via 768 to control access to via 768. FIG. 7 also shows electrical circuit 790 connected to via 766 to control access to via 766. In other embodiments, switches connected to the vias (for controlling access to the vias) can be implemented on the memory dies instead of or in addition to the switches on the control die.

Figure 8:
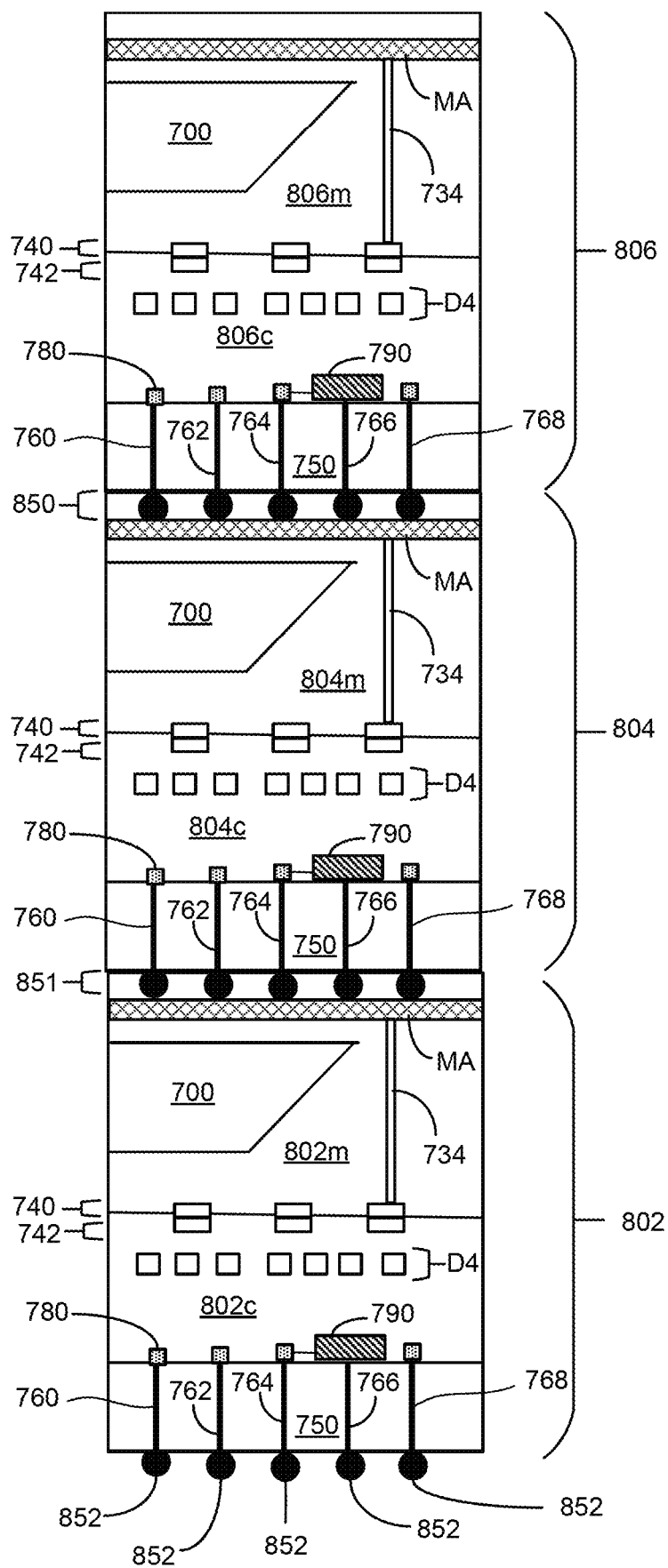
FIG. 8 is a cross section of a portion of a stack of integrated memory assemblies.

FIG. 8 depicts a non-volatile memory apparatus comprising a stack of integrated memory assemblies, where each integrated memory assembly includes the structure of FIG. 7. For example purposes, FIG. 8 shows three integrated memory assemblies 802, 804 and 806. However, in other embodiments, more than three integrated memory assemblies can be included. In one embodiment, two integrated memory assemblies can be included. Integrated memory assembly 802 includes memory die 802m bonded to control die 802c. Integrated memory assembly 804 includes memory die 804m bonded to control die 804c. Integrated memory assembly 806 includes memory die 806m bonded to control die 806c. Some of the details of integrated memory assemblies 802, 804 and 806 have been omitted from FIG. 8 for purposes of making the drawing easier to read; however, FIG. 8 does show the conductive vias 760-768 extending completely through the substrate of the control die and connecting to the top metal layer MA of the a memory die of an adjacent integrated memory assembly. In one embodiment, a micro-bump is used to connect the control die of one integrated memory assembly to the memory die of an adjacent integrated memory assembly. For example, conductive vias 760-768 extending completely through the substrate of control die 806c are connected (mechanically and electrically) at one end to top metal layer MA of memory die 804m via micro-bumps 850 and conductive vias 760-768 extending completely through the substrate of control die 804c are connected (mechanically and electrically) at one end to top metal layer MA of memory die 802m via micro-bumps 851. The conductive vias 760-768 extending completely through the substrate of control die 802c can be connected (mechanically and electrically) to a top metal layer MA of another memory die or another component by micro-bumps 852.

FIG. 8 provides an example embodiment of a non-volatile memory apparatus that comprises a first integrated memory assembly 804 and a second integrated memory assembly 806. The first integrated memory assembly 804 comprises a first memory die 804m directly connected to a first control die 804c. The first memory die 804m comprises a first non-volatile memory structure 700 and a first top metal layer MA above the first non-volatile memory structure. The first control die 804c comprises a first substrate 750 and a first control circuit 790 positioned on the substrate 750. The first control die 804c further comprises a first set of metals layers D0-D4 above the first control circuit. The first control circuit is configured to perform memory operations on the first non-volatile memory structure. The second integrated memory assembly 806 comprises a second memory die 806m directly connected to a second control die 806c. The second memory die 806m comprises a second non-volatile memory structure 700 and a second top metal layer MA above the second non-volatile memory structure. The second control die 806c comprises a second substrate 750 and a second control circuit 790 positioned on the substrate. The second control die 806c further comprises a second set of metals layers D0-D4 above the second control circuit. The second control circuit 790 is configured to perform memory operations (e.g., erasing, programming and reading) on the second non-volatile memory structure. The second integrated memory assembly 806 is stacked on top of the first integrated memory assembly 804. The second substrate comprises a set of conductive vias 760-768 extending completely through the second substrate 750 that connect at one end to the first top metal layer MA of the first memory die 804m of the first integrated memory assembly 804. The plurality of switches (e.g., 760-768) are configured to be opened and closed to provide different paths for transmitting power signals between the integrated memory assemblies.

Figure 9:
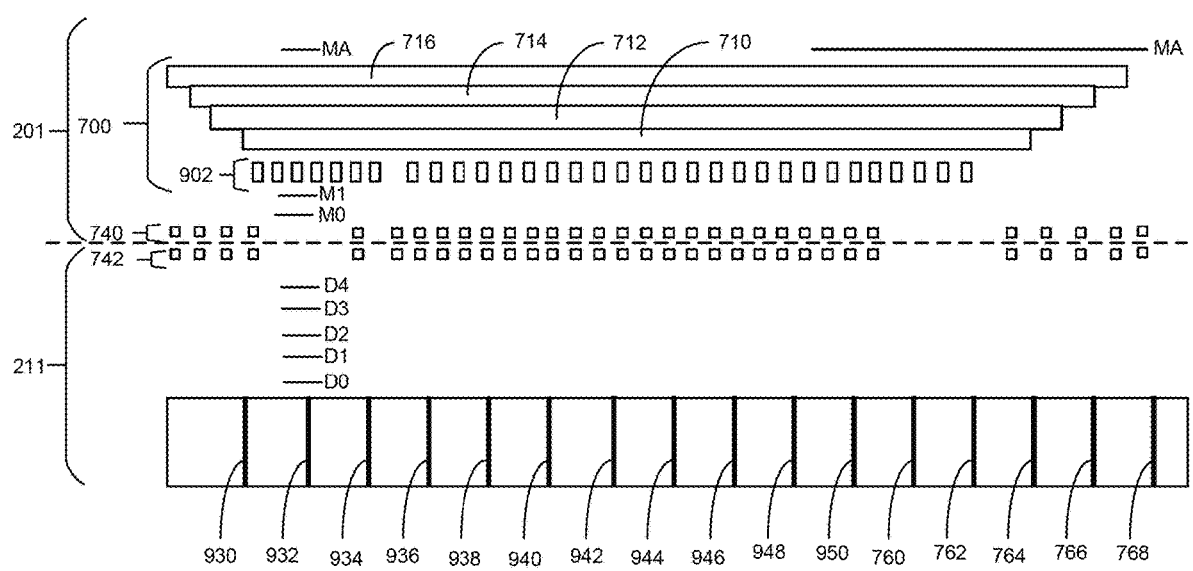
FIG. 9 is a cross section of a portion of an integrated memory assembly.

FIG. 9 provides another cross section of a portion of the same integrated memory assembly 207 depicted in FIG. 7 comprising memory die 201 bonded (or otherwise directly connected to) to a control die 211. Memory die 201 comprises a memory structure 700. To simplify the drawing, FIG. 9 only shows a subset of the word lines (710, 712, 714 and 716), without showing any of the dielectric layers. FIG. 9 also shows the bit lines 902 below the word lines and top metal layer MA above the word lines. As FIG. 9 provides a wider cross section, additional conductive vias are depicted, including conductive vias 930, 932, 934, 936, 938, 940, 942, 944, 946 and 948 that extend completely through the substrate of control die 211. These vias will be connected (via micro-bumps or other means) to a top metal layer MA of a memory die of an adjacent integrated memory assembly.

Figure 10:
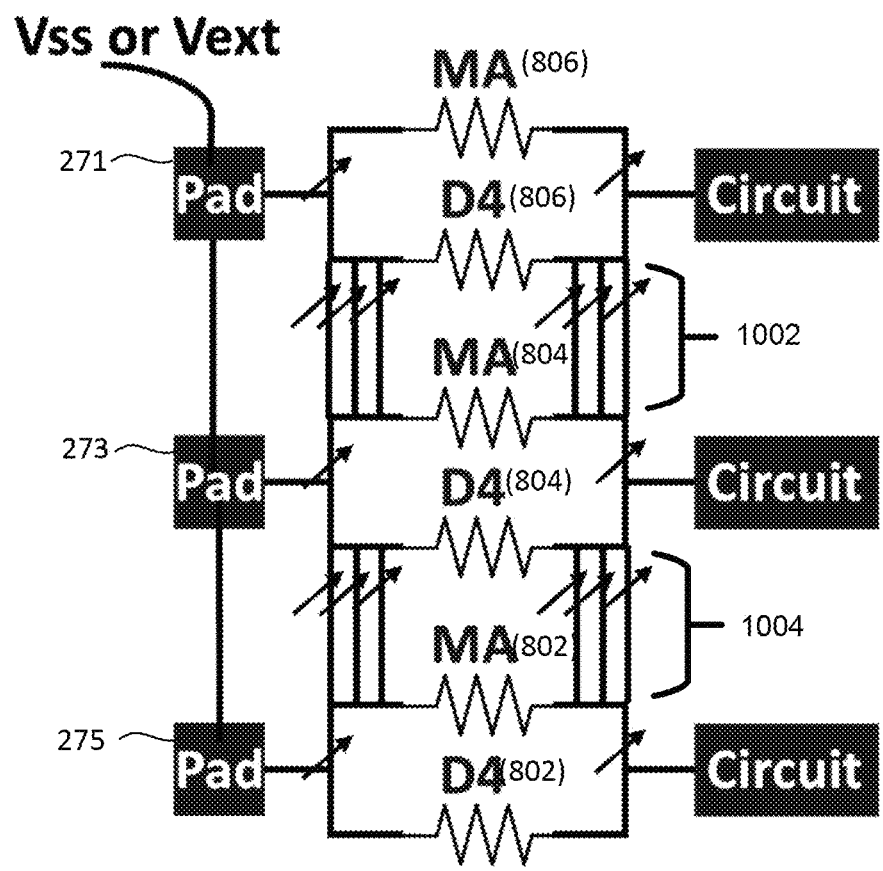
FIG. 10 is a circuit diagram.

FIG. 10 is a circuit diagram depicting one example of a circuit for routing power for the structure of FIG. 8. Three power I/O pads 271, 273 and 275 are depicted. These pads can be connected to Vss (ground) or Vext (a voltage source). Power I/O pad 271 is on integrated memory assembly 806 (and can be positioned on either the memory die or control die). Power I/O pad 273 is on integrated memory assembly 804 (and can be positioned on either the memory die or control die). Power I/O pad 275 is on integrated memory assembly 806 (and can be positioned on either the memory die or control die). One power I/O pad is depicted for each of the three integrated memory assemblies 802, 804 and 806 for example purposes and it is contemplated that each of the three integrated memory assemblies 802, 804 and 806 would have many power I/O pads connected to Vss and many power I/O pads connected to Vext.

Power I/O pad 271 is connected to top metal layer MA of integrated memory assembly 806 [labeled as MA(806)] and to metal layer D4 of integrated memory assembly 806 [labeled as D4(806)]. Power I/O pad 273 is connected to top metal layer MA of integrated memory assembly 804 [labeled as MA(804)] and to metal layer D4 of integrated memory assembly 804 [labeled as D4(804)]. Power I/O pad 275 is connected to top metal layer MA of integrated memory assembly 802 [labeled as MA(802)] and to metal layer D4 of integrated memory assembly 802 [labeled as D4(802)]. Metal layer D4 of integrated memory assembly 806 is electrically connected to top metal layer MA of integrated memory assembly 804 by way of vias 1002 through the substrate of the control die for integrated memory assembly 806, where vias 1002 include vias 762-768 of FIG. 8. Metal layer D4 of integrated memory assembly 804 is electrically connected to top metal layer MA of integrated memory assembly 802 by way of vias 1004 through the substrate of the control die for integrated memory assembly 806, where vias 1004 include vias 762-768 of FIG. 8.

The power lines depicted in the circuit of FIG. 10 include arrows drawn at 45 degree angles. These arrows represent switches (e.g., transistors), such as switches 780-786. The plurality of switches are configured to be opened and closed to provide different paths for transmitting power signals between the different integrated memory assemblies (e.g., between integrated memory assemblies 802, 804 and 806). In this manner, a smaller portion of D4 and MA can be dedicated to power lines and if a particular die needs more power than available in its own metal lines it can obtain the extra power from an adjacent die (or another die on the stack). In some embodiments, vias can be added to the memory controller die so that the memory controller can be part of the shared power grid.

FIG. 11 is a flow chart describing one embodiment of a process for fabricating a stack of integrated memory assemblies, such as during the process of fabricating the stack of integrated memory assemblies depicted in FIG. 8. Step 1102 of FIG. 11 includes creating a first integrated memory assembly comprising a first memory die bonded to a first control die. The first memory die comprises a first nonvolatile memory array and a first top metal layer (e.g., MA) above the first non-volatile memory array. For example, step 1102 may include fabricating integrated memory assembly 802 of FIG. 8 to include the structure depicted in FIG. 7.

Step 1104 includes creating a second integrated memory assembly comprising a second memory die bonded to a second control die. The second memory die comprises a second non-volatile memory array and a second top metal layer above the second non-volatile memory array. For example, step 1104 may include fabricating integrated memory assembly 804 of FIG. 8 to include the structure depicted in FIG. 7.

Step 1106 incudes stacking the second integrated memory assembly above the first integrated memory assembly. For example, integrated memory assembly 804 is stacked above integrated memory assembly 802.

Step 1108 includes connecting the exposed multiple vias of the second control die to the first top metal layer of the first memory die. For example, FIG. 8 shows vias 762-768 of integrated memory assembly 804 connected to metal layer MA of integrated memory assembly 802 via microbumps 851 (or other technology).

FIG. 12 is a flow chart describing one embodiment of a process performed while fabricating a control die of an integrated memory assembly. Each of steps 1102 and 1104 comprise fabricating a memory die, fabricating a control die and connecting (e.g., bonding) the memory die to the control die to form an integrated memory assembly. The process of FIG. 12 is performed during each of steps 1102 and 1104 as part of the fabrication of the control die.

Figure 13:
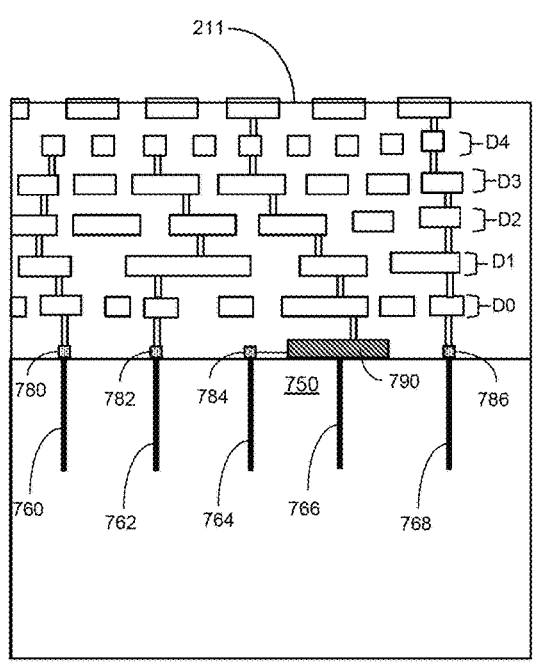
FIG. 13 is a cross section of a portion of a control die during the fabrication process.

Step 1202 of FIG. 12 includes etching a substrate of the second control die to create multiple vias only partially through the substrate. For example, FIG. 13 shows a cross section of a portion of a control die 211 after step 1202. Vias 760, 762, 764, 766 and 768 have been etched partially through the substrate 750. After etching, the vias can be filled in with Tungsten. In one embodiment, the via are etched approximately ~10-20 µm (or other depth) into the silicon substrate 750.

Figure 14:
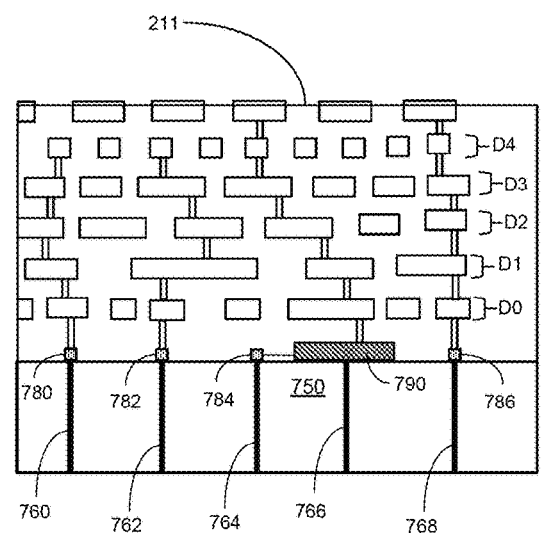
FIG. 14 is a cross section of a portion of a control die during the fabrication process.

Step 1204 includes wet etching and polishing the substrate to thin the substrate and expose the vias. In one embodiment, after using Chemical Mechanical Polishing, KOH and/or THAH are used to etch the bottom of the substrate. For example, FIG. 14 shows the same structure as FIG. 13, but after step 1204. As can be seen, the bottom of vias 760, 762, 764, 766 and 768 are exposed and available to be connected to a top metal layer MA of another integrated memory assembly.

In step 1206 of FIG. 12, circuits are added to the surface of the substrate. For example, circuit 790 is added to the top surface of substrate 750. In step 1208, metal layers (e.g., D0-D4) are added above the circuits. In step 1210, the metal layers are connected to the circuits and the vias.

A memory system has been disclosed that shares powerlines among different dies to greatly improve system powerline efficiency and strength. In some embodiments, signal lines can also be shared among dies, as described above with respect to the power lines.

One embodiment includes a non-volatile memory apparatus, comprising a first integrated memory assembly and a second integrated memory assembly. The first integrated memory assembly comprises a first memory die directly connected to a first control die. The first memory die comprises a first non-volatile memory structure and a first top metal layer above the first non-volatile memory structure. The first control die comprises a first substrate and a first control circuit positioned on the substrate. The first control die further comprises a first set of metals layers above the first control circuit. The first control circuit is configured to perform memory operations on the first non-volatile memory structure. The second integrated memory assembly comprises a second memory die directly connected to a second control die. The second memory die comprises a second non-volatile memory structure and a second top metal layer above the second non-volatile memory structure. The second control die comprises a second substrate and a second control circuit positioned on the substrate. The second control die further comprises a second set of metals layers above the second control circuit. The second control circuit is configured to perform memory operations (e.g., erasing, programming and reading) on the second non-volatile memory structure. The second integrated memory assembly is stacked on top of the first integrated memory assembly. The second substrate comprises a set of conductive vias extending completely through the second substrate that connect at one end to the first top metal layer of the first memory die of the first integrated memory assembly.

In one example implementation, the conductive vias completely through the second substrate transmit power signals, the first integrated memory assembly further comprises a first set of power pads connected to the first top metal layer and the first set of metal layers, the second integrated memory assembly further comprises a second set of power pads connected to the second top metal layer and the second set of metal layers, the set of conductive vias connect at a second end to the second set of metal layers for transmitting power signals between the first integrated memory assembly and the second integrated memory assembly, the second control die comprises a plurality of switches that are connected to and control access to the conductive vias; and the plurality of switches are configured to be opened and closed to provide different paths for transmitting power signals between the first integrated memory assembly and the second integrated memory assembly.

One embodiment includes a non-volatile memory apparatus, comprising: a stack of integrated memory assemblies, each integrated memory assembly of the stack includes a memory die bonded to a control die and a set of power pads connected to metal power lines in the respective memory die and the respective control die; and means for switchably routing the power signals between the integrated memory assemblies of the stack through substrates of the control dies to adjacent memory dies of different integrated memory assemblies. Examples of the means for switchably routing comprises the structures of FIGS. 7, 8 and/or 9, as controlled by state machine 262, including the depicted switches (e.g., 780-786) that are configured to be opened and closed to provide different paths for transmitting power signals between the integrated memory assemblies (se per FIG. 10).

One embodiment includes a method of fabricating nonvolatile memory, comprising: creating a first integrated memory assembly comprising a first memory die bonded to a first control die, the first memory die comprises a first non-volatile memory array and a first top metal layer above the first non-volatile memory array; and creating a second integrated memory assembly comprising a second memory die bonded to a second control die, the second memory die comprises a second non-volatile memory array and a second top metal layer above the second non-volatile memory array. The creating the second integrated memory assembly comprises: etching a substrate of the second control die to create multiple vias only partially through the substrate, wet etching and polishing the substrate to thin the substrate and expose the multiple vias, adding circuits to the surface of the substrate, adding metal layers above the circuits, and connecting the metal layers to the circuits and the vias. The method further comprises connecting the exposed multiple vias of the second control die to the first top metal layer of the first memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory apparatus, comprising:
    a first integrated memory assembly comprising a first memory die directly connected to a first control die, the first memory die comprises a first non-volatile memory structure and a first top metal layer above the first non-volatile memory structure, the first control die comprises a first substrate and a first control circuit positioned on the substrate, the first control die further comprises a first set of metals layers above the first control circuit, the first control circuit is configured to perform memory operations on the first non-volatile memory structure; and
    a second integrated memory assembly comprising a second memory die directly connected to a second control die, the second memory die comprises a second non-volatile memory structure and a second top metal layer above the second non-volatile memory structure, the second control die comprises a second substrate and a second control circuit positioned on the substrate, the second control die further comprises a second set of metals layers above the second control circuit, the second control circuit is configured to perform memory operations on the second non-volatile memory structure, the second integrated memory assembly is stacked on top of the first integrated memory assembly, the second substrate comprises a set of conductive vias extending completely through the second substrate that connect at one end to the first top metal layer of the first memory die of the first integrated memory assembly.

2. The non-volatile memory apparatus of claim 1, wherein:
    the conductive vias completely through the second substrate transmit power signals.

3. The non-volatile memory apparatus of claim 2, wherein:
    the power signals comprise ground signals.

4. The non-volatile memory apparatus of claim 2, wherein:
    the power signals comprise voltage source signals.

5. The non-volatile memory apparatus of claim 1, wherein:
    the second control die comprises a plurality of switches that are connected to and control access to the conductive vias.

6. The non-volatile memory apparatus of claim 5, wherein:
    the plurality of switches are configured to be opened and closed to provide different paths for transmitting power signals between the first integrated memory assembly and the second integrated memory assembly.

7. The non-volatile memory apparatus of claim 1, wherein:
    the set of conductive vias connect at a second end to the second set of metal layers for transmitting power signals between the first integrated memory assembly and the second integrated memory assembly.

8. The non-volatile memory apparatus of claim 1, wherein:
    the set of conductive vias connect at a second end to the second control circuit for transmitting power signals between the first integrated memory assembly and the second integrated memory assembly.

9. The non-volatile memory apparatus of claim 1, wherein:
    the conductive vias completely through the second substrate transmit power signals;
    the first integrated memory assembly further comprises a first set of power pads connected to the first top metal layer and the first set of metal layers;
    the second integrated memory assembly further comprises a second set of power pads connected to the second top metal layer and the second set of metal layers;
    the set of conductive vias connect at a second end to the second set of metal layers for transmitting power signals between the first integrated memory assembly and the second integrated memory assembly;
    the second control die comprises a plurality of switches that are connected to and control access to the conductive vias; and
    the plurality of switches are configured to be opened and closed to provide different paths for transmitting power signals between the first integrated memory assembly and the second integrated memory assembly.

10. The non-volatile memory apparatus of claim 1, wherein:
    the conductive vias comprise metal.

11. The non-volatile memory apparatus of claim 1, wherein:
    the conductive vias comprise tungsten.

12. The non-volatile memory apparatus of claim 1, wherein:
the set of conductive vias comprise thousands of metal vias completely through the second substrate.

13. The non-volatile memory apparatus of claim 1, wherein:
the memory operations include erasing, programming and reading.

14. A non-volatile memory apparatus, comprising:
a stack of integrated memory assemblies, each integrated memory assembly of the stack includes a memory die bonded to a control die and a set of power pads connected to metal power lines in the respective memory die and the respective control die, each memory die of the stack include a three dimensional non-volatile memory array; and
means for switchably routing the power signals between the integrated memory assemblies of the stack through substrates of the control dies to adjacent memory dies of different integrated memory assemblies, the means for switchably routing includes a plurality of conductive vias completely through the substrates of the control dies that connect to metal layers above the three dimensional non-volatile memory arrays of adjacent memory dies of different integrated memory assemblies.

15. The non-volatile memory apparatus of claim 14, wherein:
the means for switchably routing further includes a plurality of switches on the control dies that are connected to and control access to the plurality of conductive vias.

16. The non-volatile memory apparatus of claim 15, wherein:
the plurality of switches are configured to be opened and closed to provide different paths for transmitting power signals between integrated memory assemblies.

17. The non-volatile memory apparatus of claim 16, wherein:
the power signals comprise a ground signal and a voltage source signal.

* * * * *